United States Patent
Zanetti et al.

(10) Patent No.: US 12,154,995 B2
(45) Date of Patent: Nov. 26, 2024

(54) METHOD TO ENHANCE THE KESTERITE SOLAR CELL PERFORMANCE

(71) Applicant: Isopan S.p.A., Verona (IT)

(72) Inventors: Solidea Zanetti, Verona (IT); Alessandro Romeo, Verona (IT); Elisa Artegiani, Verona (IT); Prabeesh Punathil, Verona (IT)

(73) Assignee: ISOPAN S.P.A., Verona (IT)

( * ) Notice: Subject to any disclaimer, the term of this patent is extended or adjusted under 35 U.S.C. 154(b) by 0 days.

(21) Appl. No.: 17/867,290

(22) Filed: Jul. 18, 2022

(65) Prior Publication Data

US 2023/0060927 A1  Mar. 2, 2023

(30) Foreign Application Priority Data

Jul. 16, 2021 (IT) .................. 102021000018911

(51) Int. Cl.
  *H01L 31/032*  (2006.01)
  *C23C 14/06*  (2006.01)
  *C23C 14/18*  (2006.01)
  *H01L 31/0749*  (2012.01)

(52) U.S. Cl.
  CPC ...... *H01L 31/0322* (2013.01); *C23C 14/0629* (2013.01); *C23C 14/18* (2013.01); *H01L 31/0749* (2013.01)

(58) Field of Classification Search
  None
  See application file for complete search history.

(56) References Cited

U.S. PATENT DOCUMENTS

| | | | |
|---|---|---|---|
| 6,258,620 B1* | 7/2001 | Morel | H01L 31/1828 |
| | | | 257/E31.007 |
| 2013/0074914 A1* | 3/2013 | Foust | H01L 31/02963 |
| | | | 136/260 |
| 2013/0104972 A1* | 5/2013 | Jeong | H01L 31/0749 |
| | | | 438/94 |
| 2015/0136216 A1* | 5/2015 | Kurihara | H01L 31/0326 |
| | | | 136/256 |

FOREIGN PATENT DOCUMENTS

CN        110112062 A       8/2019

OTHER PUBLICATIONS

Hadke et al. "Synergistic Effects of Double Cation Substitution in Solution-Processed CZTS Solar Cells with over 10% Efficiency", Advanced Energy Materials, 2018, 8, All Pages. (Year: 2018).*
Fu et al. "Improving the Performance of Solution-Processed Cu2ZnSn(S,Se)4 Photovoltaic Materials by Cd2+ Substitution", Chemistry of Materials, 28, 2016, All Pages. (Year: 2016).*
CSI "How to Apply Spin Coating", https://coatingsystems.com/apply-spin-coating/, All Pages 2018. (Year: 2018).*

(Continued)

*Primary Examiner* — Daniel P Malley, Jr.
(74) *Attorney, Agent, or Firm* — Tutunjian & Bitetto, P.C.

(57) ABSTRACT

The present invention relates to a method for obtaining a photovoltaic CZTS thin-film solar cell including arranging a precursor solution, preparing a substrate, and depositing said precursor solution on said substrate.

9 Claims, 4 Drawing Sheets

(56) References Cited

OTHER PUBLICATIONS

Hadke et al., "Synergistic Effects of Double Cation Substitution in Solution-Processed CZTS Solar Cells with over 10% Efficiency", Advanced Energy Materials, 8, 2018, All Pages. (Year: 2018).*

Su et al., "Cation Substitution of CZTS Solar Cell with > 10% Efficiency", In2016 IEEE 43rd Photovoltaic Specialists Conference (PVSC) Jun. 5, 2016 (pp. 0534-0538). IEEE.

Hadke et al., "Synergistic Effects of Double Cation Substitution in Solution-Processed CZTS Solar Cells with over 10% Efficiency" Advanced Energy Materials, https://doi.org/10.1002/aenm.201802540, Nov. 2018, pp. 1-10.

Luan et al., "Mechanism of enhanced power conversion efficiency of Cu2ZnSn (S, Se) 4 solar cell by cadmium surface diffusion doping", Journal of Alloys and Compounds. Sep. 25, 2021, pp. 1-8.

* cited by examiner

METHOD TO ENHANCE THE KESTERITE SOLAR CELL PERFORMANCE

TECHNICAL FIELD OF THE INVENTION

The present invention relates to the technical field of kesterite thin-film solar cells, for example CZTS, CZTSSe or CZTSe thin-film solar cells. More particularly, the invention relates to a simple and a rapid method to improve the efficiency of the kesterite thin-film solar cells, for example CZTS, CZTSSe or CZTSe solar cell.

BACKGROUND

Thin-film solar cells (TFSC) are a promising approach for terrestrial and space photovoltaics and offer a wide variety of choices in terms of the device design and fabrication. Thin-film photovoltaic devices have the fundamental advantages of using small quantities of active material and of lending themselves well to the development of large modules. Thanks to these characteristics, they guarantee a safe way to reduce the cost in €/Wp of photovoltaic modules and, once high efficiencies are obtained, are able to conquer significant market shares. The inorganic thin-film technology that has achieved the highest conversion efficiency is the one based on copper-indium-gallium-selenium alloy: CIGS (efficiency record over 23%), however the current world production rate of indium might limit the module production in very large scale. Researchers have therefore begun to develop materials similar to CIGS, in which indium and gallium are replaced by a pair of metals whose chemical composition is $Cu_2$—X—Y—$Z_4$. The most studied compounds are $Cu_2ZnSnS_4$ (kesterite) and $Cu_2ZnSnSe_4$ or a mix of them: $Cu_2ZnSn(S,Se)_4$. This patent is focused on this class of materials, which are indicated in the following as CZTS.

Although CZTS is a material that has already been studied by several groups, still sufficient knowledge has not yet been achieved. In particular one of the crucial pathways to increase the efficiency, that is still relatively low, is the doping of the absorber material. This needs to address on one hand the right elements that are able to be included in the CZTSSe matrix and at the same time to dope the material.

In this sense many have tried to find a solution for this process step. Hereinafter, some publications dealing with CZTSSe solar cell's doping are recalled.

"Cation Substitution of CZTS Solar Cell with >10% Efficiency" Zhenghua Su, Wenjie Li, Guchhait Asim, Tay Ying Fan and Lydia Helena Wong 2016 IEEE 43rd Photovoltaic Specialists Conference (PVSC), 2016, pp. 0534-0538, doi: 10.1109/PVSC.2016.7749651;

"Synergistic Effects of Double Cation Substitution in Solution-Processed CZTS Solar Cells with over 10% Efficiency" Hadke, S. H., Levcenko, S., Lie, S., Hages, C. J., Márquez, J. A., Unold, T., Wong, L. H., Adv. Energy Mater. 2018, 8, 1802540. https://doi.org/10.1002/aenm.201802540;

"Mechanism of enhanced power conversion efficiency of $Cu_2ZnSn(S, Se)_4$ solar cell by cadmium surface diffusion doping". Luan H, Yao B, Li Y, Liu R, Ding Z, Zhang Z, Zhao H, Zhang L. Journal of Alloys and Compounds; 876 (2021) 160160.https://doi.org/10.1016/j.jallcom.2021.160160.

There has been already a patent (CN110112062A) for preparing CZTS thin film solar cell using group IIIA element but for doping the cadmium sulfide film, used as buffer layer.

Kesterite class of materials has optimal bandgap range with high absorption coefficient. To date, the highest certified device efficiency of 12.6% has been obtained by hydrazine based pure solution-based approach. However, the toxicity of hydrazine used in this process to dissolve inorganic materials is a safety concern for large-area manufacturing. The record efficiency of CZTSSe is still too low compared to performances of similar PV materials.

SUMMARY OF THE INVENTION

The main object of the present invention is to propose a new method for obtaining a photovoltaic kesterite thin-film solar cell, for example a photovoltaic CZTS, CZTSSe or CZTSe thin-film solar cell.

Another object of the present invention is providing a simple method to improve the photovoltaic performances of a photovoltaic kesterite thin-film solar cell, for example a photovoltaic CZTS, CZTSSe or CZTSe thin-film solar cell by using a fast surface treatment that can be easily implemented in an industrial scale production process.

According to an aspect of the invention, a method according to the present application is provided.

The present application refers to preferred and advantageous embodiments of the invention.

BRIEF DESCRIPTION OF THE DRAWINGS

Other features and advantages of the invention will be more evident from the following description, also referring to the accompanying drawings in which.

DETAILED DESCRIPTION OF THE INVENTION

Figure 1:
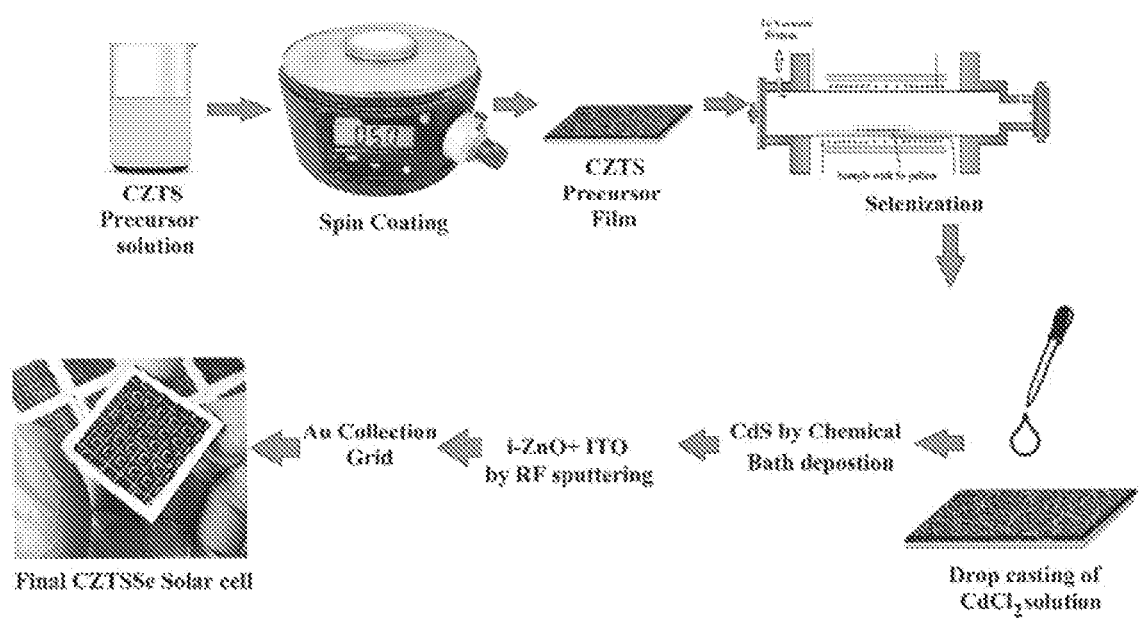
FIG. 1 is a schematic diagram of CZTSSe solar cell fabrication including all the steps of the process from the precursor solution to the final device.

A method according to the present invention for obtaining a photovoltaic kesterite thin-film solar cell, for example a photovoltaic CZTS, CZTSSe or CZTSe thin-film solar cell including the following step:
arranging a kesterite film, for example a CZTS, CZTSSe or CZTSe film, for example a precursor solution,
preparing a substrate, and
depositing said film on the substrate.

According to the present invention, the kesterite thin-film solar cell advantageously comprises or consists of one or more of the following: Cu2ZnSnS4, Cu2ZnSnSe4, Cu2ZnSn(Se,S)4, Ag2ZnSnSe4, Ag2ZnSn(Se,S)4, Ag2ZnSn(Se,S)4, (Cu,Ag)2ZnSnSe4, (Cu,Ag)2ZnSnS4, (Cu,Ag)2ZnSn(Se,S)4, (Cu,Ag)2ZnSnSe4, (Cu,Ag)2ZnSnS4, (Cu,Ag)2ZnSn(Se,S)4, Cu2Zn(Sn,Ge)S4, Cu2Zn(Sn,Ge)Se4, Cu2Zn(Sn,Ge)(S,Se)4, (Cu,Ag)2Zn(Sn,Ge)S4, (Cu,Ag)2Zn(Sn,Ge)Se4, (Cu,Ag)2Zn(Sn,Ge)(S,Se)4, Cu2(Zn,Mg)(Sn,Ge)S4, Cu2(Zn,Mg)(Sn,Ge)Se4, Cu2(Zn,Mg)(Sn,Ge)(S,Se)4, (Cu,Ag)2(Zn,Mg)(Sn,Ge)(S,Se)4, (Cu,Ag)2(Zn,Mg)(Sn,Ge)S4, (Cu,Ag)2(Zn,Mg)(Sn,Ge)Se4, (Cu,Ag)2(Zn,Mg)Sn(S,Se)4, (Cu,Ag)2(Zn,Mg)SnS4, (Cu,Ag)2(Zn,Mg)SnSe4, Cu2(Zn,Cd)SnS4, Cu2(Zn,Cd)Sn(S,Se)4, Cu2(Zn,Cd)Sn(S,Se)4, (Li,Cu)2ZnSn(S,Se)4, (Li,Cu)2ZnSnS4, (Li,Cu)2ZnSnSe4, (Cu,Mg)ZnSnSe4, (Cu,Mg)ZnSn(S,Se)4, (Cu,Mg)ZnSnS4, Cu2ZnSiSe4, Cu2ZnSiS4, Cu2ZnSi(S,Se)4, Cu2Zn(Si,Sn)(S,Se)4, Cu2Zn(Si,Sn)S4, Cu2Zn(Si,Sn)Se4, Cu2(Zn,Fe)SnS4, Cu2(Zn,Fe)Sn(S,Se)4, Cu2(Zn,Fe)SnSe4, Cu2NiSnS4, Cu2NiSnSe4 or Cu2NiSn(S,Se)4 thin-film solar cell.

The method further includes a step of enhancing the efficiency parameters of the cell, according to which a doping compound, for example a doping solution is added comprising or consisting of at least one cadmium compound, namely a cadmium chloride compound, for example a cadmium chloride solution, which is added to the substrate after the deposition thereon of the film.

So far as the term doping is concerned, the same refers to the technique used to introduce intentionally impurities in a semiconductor in order to increase its electrical properties.

As an example, the doping cadmium compound solution can be prepared by application of cadmium chloride.

As a not limitative example, this can be obtained by dissolving a cadmium compound and/or cadmium chloride hemi (pentahydrate) ($CdCl_2 \cdot 2\frac{1}{2}H_2O$—for example 79.5-81%—40 mM, obtainable from Sigma Aldrich) in methanol.

As an alternative, cadmium acetate hydrate $Cd(CH_3COO)_2 \cdot x\ H_2O$ can be used, although cadmium chloride gives better performances.

Of course, other doping cadmium compound solution, for example other compositions including $CdCl_2$ can be used.

As an advantageous and not limitative example, the substrate can be prepared arranging a soda-lime glass (SLG) substrate, for example with a size 20-40 mm×20-40 mm, such as 30×30 mm and a thickness of about 1-5 mm, such as of about 3 mm, cleaning the same, and subsequently depositing a bilayer of molybdenum (Mo), on said soda-lime glass substrate.

As an example, the cleaning steps include one or more of the following steps:
  10-30 minutes, for example 15 minutes ultrasonically cleaning, if desired in soap solution,
  10-30 minutes, for example 20 minutes in boiling water, and
  10-30 minutes, for example 15 minutes ultrasonically cleaning, if desired in iso propanol.

After such step/s a drying step can be carried, for example with free flow of argon gas.

Referring in particular to the deposition step, the same can be targeted on the cleaned glass surface.

More advantageously, the molybdenum (Mo), for example bilayer, is deposited by RF sputtering from a Mo target, i.e. molybdenum sputtering targets (for example 99.95% purity; Circular: Diameter<=3 inch, Thickness>=3 mm; obtainable from Testbourne Ltd) on the soda-lime glass substrate.

In this respect, as a not limitative embodiment, a first, more adhesive, Mo layer, for example with a thickness of 500-1000 nm, if desired 700 nm, is deposited, for example at a pressure of $1 \times 10^{-2}$ mbar by an Ar flux of 30 sccm with a sputtering power of 100 W, whereas a second, more conductive, for example 300-800 nm, if desired 500 nm, thick Mo layer is deposited, for example at a pressure of $3 \times 10^{-3}$ mbar by an Ar flux of 20 sccm with a sputtering power of 150 W. Both layers can be deposited at a substrate temperature ranging preferably from 100° C. to 300° C., for example of 200° C.

So far as the kesterite film, for example the CZTS, CZTSSe or CZTSe film obtainment and deposition are concerned, many physical and chemical methods can be employed for manufacturing respective thin films, such as thermal evaporation, atom beam sputtering, hybrid sputtering, RF magnetron sputtering, sulphurisation of electron beam evaporated precursors, pulsed laser deposition, sol-gel spin coating technique, spray pyrolysis technique, ultrasonic spray pyrolysis, electrodeposition, successive ionic layer adsorption reaction (SILAR) technique, nanoparticle route etc.

As a not limitative embodiment, kesterite, for example CZTS, CZTSSe or CZTSe can be fabricated by spin coating a respective precursor solution onto the substrate.

So far as the precursor solution is concerned, as a not limitative embodiment, the same can be deposited onto Mo coated SLG substrate by spin coating at 1000-5000 rpm for 5-60 seconds, for example 2400 rpm for 15 seconds, followed by drying at 200° C.-400° C. in air for 1-10 min, for example at 300° C. in air for 5 min. This step can be for example repeated 3 to 6 times to obtain a 1-2 μm thick film, for example it can be repeated 5 times to obtain a 1.6 μm thick film.

Preferably, the deposition of the kesterite, for example CZTS, CZTSSe or CZTSe, for example a precursor solution is targeted on top of the layer of molybdenum deposited as first layer, which acts as back contact of the solar cell.

According to a not limitative embodiment, the step of preparing a kesterite, for example a CZTS, CZTSSe or CZTSe, for example a precursor solution is carried out by dissolving copper, zinc, tin and sulfur derivatives or compounds into ethanol. Preferably, the step of preparing a kesterite, for example a CZTS, CZTSSe or CZTSe, for example a precursor solution is carried out by dissolving copper (II) acetate monohydrate ($C_4H_8CuO_5$—for example ≥99%—0.574 M, obtainable from Merc Chemicals), zinc (II) acetate dihydrate ($C_4H_{10}O_6Zn$—for example ≥99%—0.375 M, obtainable from -Sigma Aldrich), tin (II) chloride dehydrate ($SnCl_2\ 2H_2O$—for example ≥98%—0.3 M, obtainable from Fluke chemicals), and thiourea ($NH_2CSNH_2$—for example 99%—2.4 M, obtainable from Sigma Aldrich) into 2-methoxy ethanol ($CH_3OCH_2CH_2OH$—for example ≥99.8%, obtainable from Sigma Aldrich).

In this respect, a stabilizer can be added during said step of preparing a precursor solution. To this regard, diethanolamine ($HN(CH_2CH_2OH)_2$—for example ≥98%, obtainable from Sigma Aldrich) can be used as a stabilizer during the step of preparing a precursor solution.

If desired, the method can include a step of selenization of the CZTS film, for example the CZTS precursor film is provided. To this regard, the CZTS precursor films can be annealed at 300-500° C. for 10-50 min, for example at 450° C. for 30 min, in a selenium atmosphere to complete the phase formation and to incorporate Se into the CZTS lattice. As a not limitative example of reactor, a single zone horizontal tube furnace for selenization can be used.

Referring more in particular to the step concerning the addition of the doping cadmium chloride compound, for example a doping cadmium chloride solution to the substrate with the CZTS, CZTSSe or CZTSe, according to a not limitative embodiment the same can be carried out dropwise, for example adding drops (for example from 5 to 30 drops, if desired about 10 drops) of $CdCl_2$ solution onto the CZTS, CZTSSe or CZTSe film, for example to the Mo coated SLG substrate with the precursor solution, for example after the optional annealing step. According to a not limitative embodiment, this treatment can be made after the selenization process, for example adding drops in order to cover substantially completely the surface of the absorber layer.

The $CdCl_2$ is preferably added on top of the CZTSSe film.

Moreover, a method according to the present invention can also include a step of depositing a buffer/window layer. As a not limitative embodiment, it can be a CdS buffer layer, with a thickness for example ranging from 40 nm to 100 nm, for example about 60 nm, by chemical bath deposition after the step of adding the doping cadmium compound, for example for example a doping cadmium chloride solution.

In this respect, advantageously, 10 to 30 ml, for example 15 ml of cadmium acetate dihydrate ($Cd(CH_3COO)_2\ 2H_2O$) solution (for example 98%-0.025 M, obtainable from Merck chemicals), 5 to 20 ml, for example 10 ml of thiourea (for example 0.422 M) and 10 to 30 ml, for example 25 ml of ammonia ($NH_4OH$, 20%) solution are added to 100 to 300 ml, for example 200 ml of distilled water and then the substrate with the precursor solution is coated with such solutions at a temperature of 40-80° C. for 5-30 minutes, for example of 60° C. for 10 minutes.

If desired, a transparent conductive oxide layer as front contact, preferably, a ZnO (zinc oxide) and ITO (indium tin oxide) layer can be deposited on the treated substrate, i.e. the CZTS, CZTSSe or CZTSe samples, for example on top thereof.

In this respect, as a not limitative example, 80 nm thick intrinsic ZnO and 1 μm thick ITO can be deposited by RF sputtering. The deposition can be carried out with a power of 60 W for ZnO and 160 W for ITO with a substrate temperature of 150° C. with continuous oxygen flux ($O_2$:0.5 sccm) at 150° C.

The present invention also relates to a photovoltaic CZTS thin-film solar cell obtained owing to a method as above described.

Moreover, a subject-matter of the present invention is also the use of a doping cadmium compound, for example a doping cadmium chloride solution for obtaining a photovoltaic CZTS, CZTSSe or CZTSe thin-film solar cell with enhanced solar properties.

In this respect, as a not limitative example the doping cadmium chloride can be prepared as above-indicated, for example dissolving cadmium chloride in a solvent, such as for example methanol, as a not limitative example cadmium chloride hemi (pentahydrate) ($CdCl_2 \cdot 2\frac{1}{2}H_2O$—for example 79.5-81%—40 mM, obtainable from Sigma Aldrich) in methanol.

To this regard, such solution could be added dropwise onto the CZTS, CZTSSe or CZTSe film, for example to a Mo coated SLG substrates treated with a precursor solution.

A number of tests were performed on a solar cell obtained as above-indicated.

In this respect, according to a not limitative embodiment, 30 nm gold collection grid has been deposited on the solar cell by thermal evaporation technique, and the active area (0.13 $cm^2$) of the cell is determined by mechanical scribing. So far as the collection grid is concerned, it is a metal contact deposited by a thermal evaporation technique on top of the solar cell. This grid improves the collection of photo generated electrons/holes in the solar cell.

Moreover, the structural properties of the CZTSSe film have been analyzed by X-ray diffraction (XRD) and Raman spectroscopy.

The surface morphology of the films CZTSSe was instead analyzed by atomic force electron microscopy (AFM).

Finally, the J-V characteristics of the solar cells with an active area of 0.13 $cm^2$ were measured under AM1.5 solar irradiation with 1000 $W/m^2$ light intensity.

Figure 2:
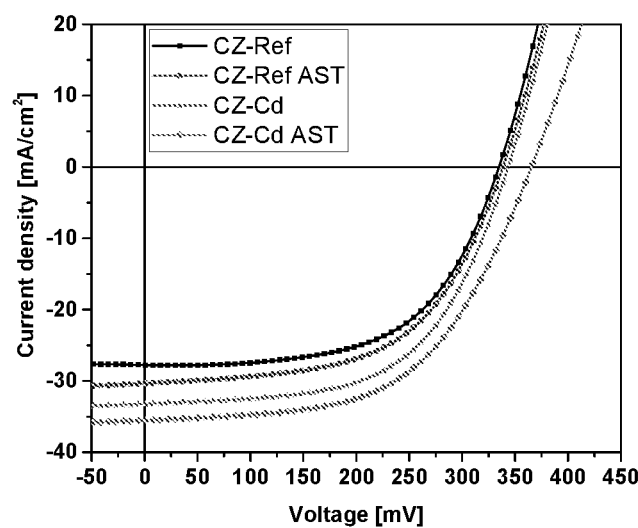
FIG. 2 shows J-V characteristics (Current density-voltage characteristics) of the reference and $CdCl_2$ treated CZTSSe solar cells before and after Accelerated Stability Test (AST)

To this regard, FIG. 2 shows J-V characteristics (Current density-voltage characteristics) of the reference and $CdCl_2$ treated CZTSSe solar cells before and after Accelerated Stability Test (AST), and some details extracted from FIG. 2 are shown in the following table:

| Sample | $V_{oc}$ (mV) | $J_{sc}$ (mA/$cm^2$) | FF (%) | η (%) |
|---|---|---|---|---|
| CZ-Ref | 334 | 28 | 58 | 5.42 |
| CZ-CdCl | 344 | 33 | 57 | 6.47 |
| AST-CZ-Ref | 339 | 31 | 55 | 5.78 |
| AST-CZ-CdCl | 367 | 36 | 55 | 7.27 |

As a matter of fact:

J-V characteristics show a 1% enhancement in efficiency after $CdCl_2$ treatment;

both $V_{oc}$ and $J_{sc}$ of the devices are improved after the treatment;

the stability of the device AST carried out was analysed and an enhancement in efficiency after 24 hr was detected;

the highest conversion efficiency of 7.27% is obtained after AST.

Figure 3:
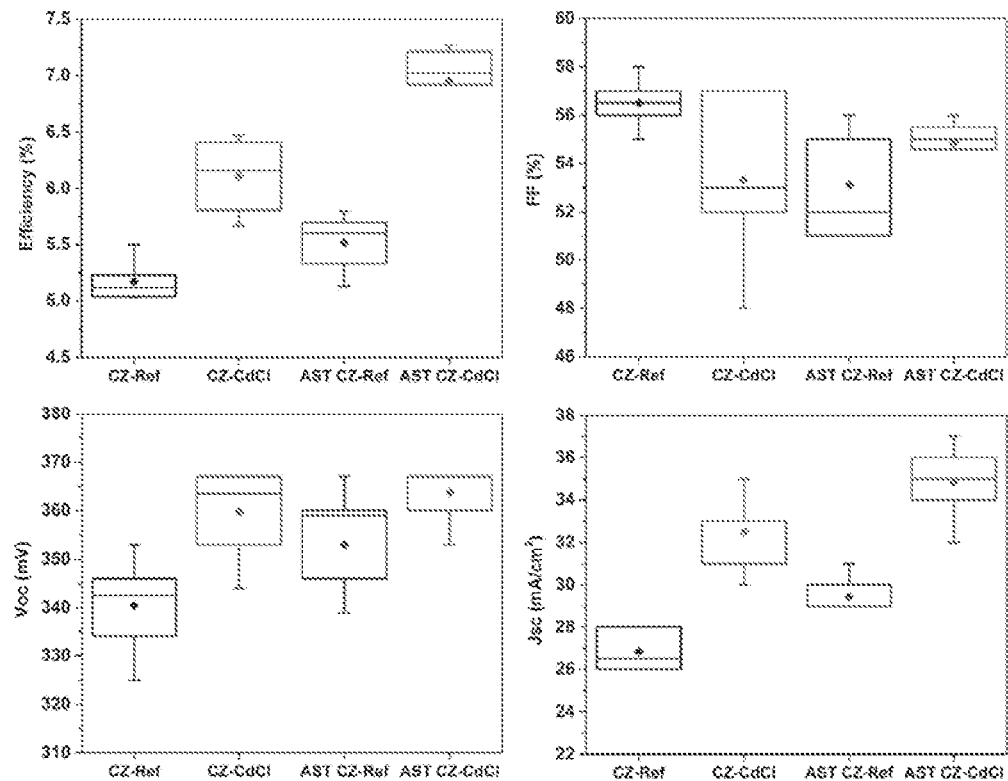
FIG. 3 illustrates a statistical Box plot of J-V characteristics of the reference and $CdCl_2$ treated CZTSSe solar cells before and after AST.
Figure 4:
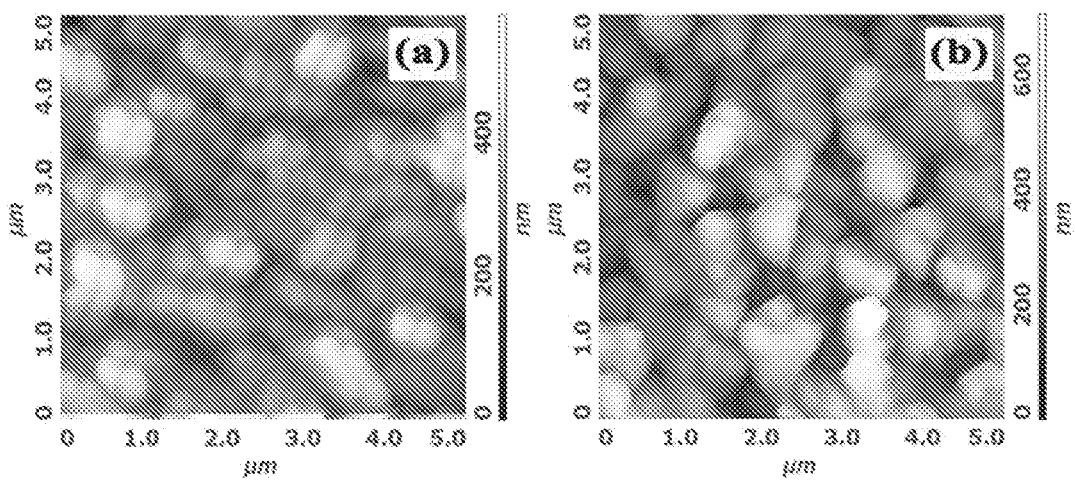
FIG. 4 shows an AFM image of the CZTSSe absorber material (a) before and (b) after $CdCl_2$ treatment.

With reference now to FIG. 3, which illustrates a statistical Box plot of J-V characteristics of the reference and $CdCl_2$ treated CZTSSe solar cells before and after AST, average and highest performance factors are shown in the statistical box plot, and, except the FF, average performance factors result to be improved after the surface treatment with $CdCl_2$.

Figure 5:
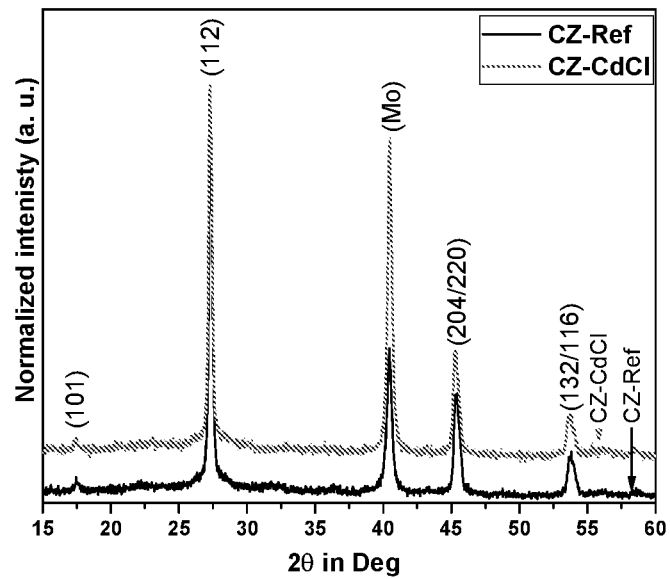
FIG. 5 relates to a XRD pattern of the CZTSSe absorber material (a) before and (b) after $CdCl_2$ treatment.

So far as FIG. 5 (relating to a XRD pattern of the CZTSSe absorber material (a) before and (b) after $CdCl_2$ treatment) is concerned, XRD pattern matches the standard ICDD (ICDD-01-082-9159) pattern of the CZTSSe phase. Moreover, all the peaks are marked with the ICDD reference.

Figure 6:
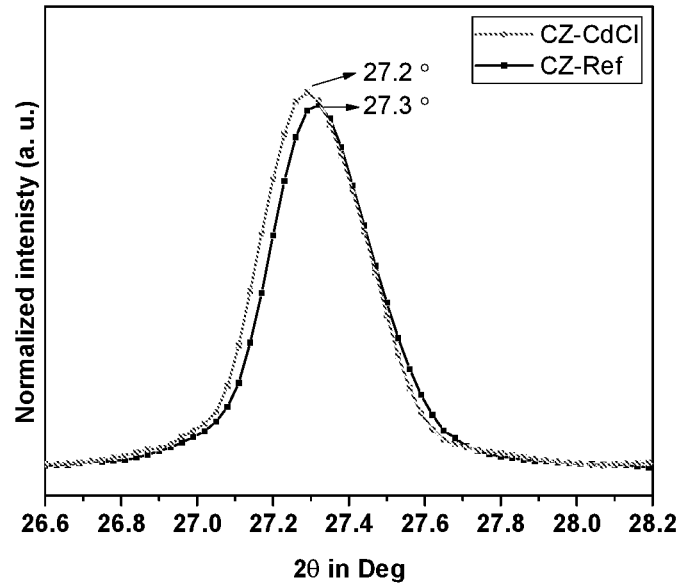
FIG. 6 shows a XRD pattern (magnified in the range between 26.6° to 28.2°) of the CZTSSe absorber material (a) before and (b) after $CdCl_2$ treatment.
Figure 7:
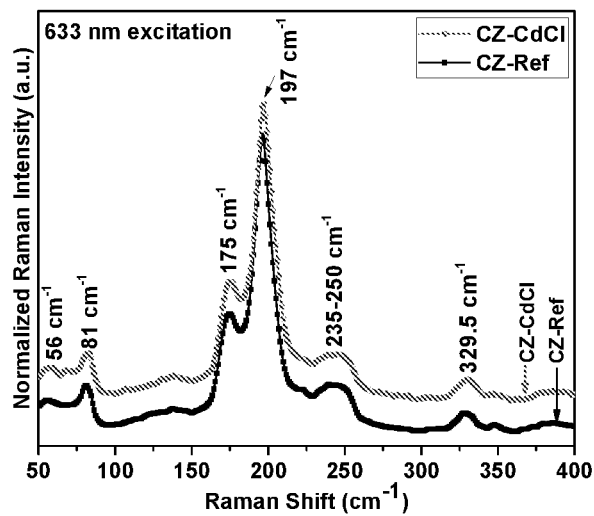
FIG. 7 regards the Raman spectra of the CZTSSe absorber material before and after $CdCl_2$ treatment.

When considering instead FIG. 6 shows a XRD pattern (magnified in the range between 26.6° to 28.2°) of the CZTSSe absorber material (a) before and (b) after $CdCl_2$ treatment. With the $CdCl_2$ treatment, a slight shift of the peak position to lower angles is observed;

Considering now FIG. 7 (Raman spectra of the CZTSSe absorber material before and after $CdCl_2$ treatment), the phase purity of the film is further confirmed by Raman spectroscopy, since both the spectra show the characteristic CZTSSe peaks at 56 $cm^{-1}$, 81 $cm^{-1}$, 175 $cm^{-1}$, 197 $cm^{-1}$, 235-250 $cm^{-1}$, 329.5 $cm^{-1}$ corresponding to the E, A, A, B and A vibrational mode of CZTSSe phase respectively. XRD and Raman confirm the formation of phase pure CZTSSe material.

Figure 8:
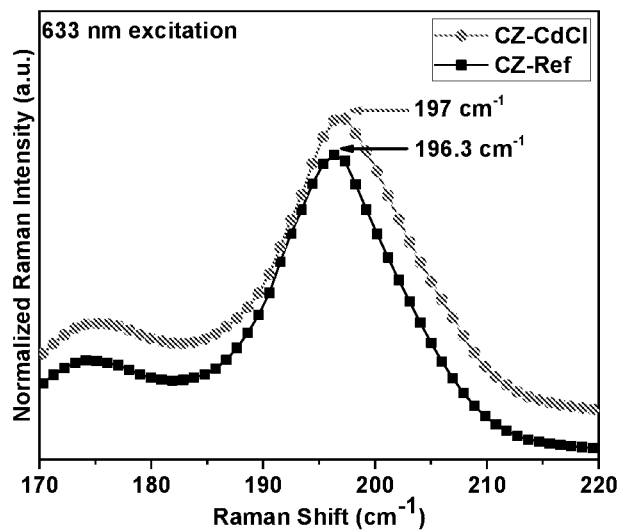
FIG. 8 shows the Raman spectra (magnified in the range between 170 $cm^{-1}$ to 220 $cm^{-1}$) of the CZTSSe absorber material (a) before and (b) after $CdCl_2$ treatment.

In connection then with FIG. 8 (Raman spectra of the CZTSSe absorber material (a) before and (b) after $CdCl_2$ treatment) a shift to a higher wavenumber is observed in the Raman spectra of treated samples.

Thus, compared to the prior art solutions, the present invention proposes a surface treatment able to improve the device efficiency by adding a simple step in the fabrication process.

As it will be understood, a number of beneficial aspects are obtained owing to the present invention.

First of all, the doping with cadmium helps improving the performances of kesterite thin-film solar cells, for example CZTS, CZTSSe or CZTSe thin-film solar cells.

Moreover, the doping process is fast and not invasive, since it does not involve the addition of other chemical substances during kesterite deposition, for example CZTS, CZTSSe or CZTSe deposition.

The amount of cadmium chloride used for surface treatment is low, so it is not affecting the total cost of the cell fabrication.

The quantity of cadmium used in the process is safe for handling and the environment.

As a matter of fact, implementing this doping process in an industrial production of kesterite, for example CZTS, CZTSSe or CZTSe solar cell is easy.

The foregoing description recalls mainly CZTS, CZTSSe or CZTSe, but all the above-mentioned kesterites should be considered as included in the scope of this invention, since all were tested and have demonstrated good results.

Changes and variants of the invention are possible within the scope defined by the claims.

The invention claimed is:

1. A method for obtaining a photovoltaic kesterite thin-film solar cell including:
    arranging a kesterite film,
    preparing a substrate,
    depositing said kesterite film on said substrate,
    adding a doping cadmium chloride solution dropwise, after the deposition of said kesterite film on said substrate, wherein the step of adding the doping cadmium chloride solution dropwise introduces impurities into the kesterite film, and
    depositing a buffer layer, wherein the buffer layer comprises a CdS buffer layer deposited by chemical bath deposition after said step of adding said doping cadmium chloride solution,
    wherein the step of depositing the CdS buffer layer comprises providing 10 to 30 ml of cadmium acetate dihydrate ($Cd(CH_3COO)_2 \cdot 2H_2O$), 5 to 20 ml of thiourea, 10 to 30 ml of ammonia solution ($NH_4OH$, 20%) and 100 to 300 ml of distilled water to form a combined solution.

2. The method as claimed in claim 1, wherein said substrate is prepared by arranging a soda-lime glass substrate, cleaning the same, and subsequently depositing at least one layer of molybdenum (Mo) on said cleaned soda-lime glass substrate.

3. The method as claimed in claim 2, wherein said at least one layer of molybdenum (Mo) comprises a molybdenum (Mo) bilayer deposited on said cleaned soda-lime glass substrate, wherein said molybdenum (Mo) bilayer is deposited by RF sputtering from a Mo target on said cleaned soda-lime glass substrate.

4. The method as claimed in claim 1, wherein said step of arranging the kesterite film comprises preparing a precursor solution by dissolving copper, zinc, tin and sulfur derivatives or sulfur compounds in ethanol.

5. The method as claimed in claim 4, wherein said step of preparing a precursor solution is carried out by dissolving copper (II) acetate monohydrate ($C_4H_8CuO_5$), zinc (II) acetate dihydrate ($C_4H_{10}O_6Zn$), tin (II) chloride dehydrate ($SnCl_2 \cdot 2H_2O$), and thiourea ($NH_2CSNH_2$) in 2-methoxy ethanol ($CH_3OCH_2CH_2OH$).

6. The method as claimed in claim 5, comprising a step of adding a stabilizer and/or diethanolamine ($HN(CH_2CH_2OH)_2$) during said step of preparing a precursor solution.

7. The method as claimed in claim 1, wherein the step of adding said doping cadmium chloride solution dropwise comprises wherein drops of $CdCl_2$ solution are added to kesterite film.

8. The method as claimed in claim 1, further comprising coating the kesterite film with the combined solution at a temperature of 40-80° C. for 5-30 minutes.

9. The method as claimed in claim 1, wherein said kesterite thin-film solar cell comprises or consists of one or more of the following:
$Cu_2ZnSnS_4$, $Cu_2ZnSnSe_4$, $Cu_2ZnSn(Se,S)_4$, $Ag_2ZnSnSe_4$, $Ag_2ZnSn(Se,S)_4$, $Ag_2ZnSn(Se,S)_4$, $(Cu,Ag)_2ZnSnSe_4$, $(Cu,Ag)_2ZnSnS_4$, $(Cu,Ag)_2ZnSn(Se,S)_4$, $(Cu,Ag)_2ZnSnSe_4$, $(Cu,Ag)_2ZnSnS_4$, $(Cu,Ag)_2ZnSn(Se,S)_4$, $Cu_2Zn(Sn,Ge)S_4$, $Cu_2Zn(Sn,Ge)Se_4$, $Cu_2Zn(Sn,Ge)(S,Se)_4$, $(Cu,Ag)_2Zn(Sn,Ge)S_4$, $(Cu,Ag)_2Zn(Sn,Ge)Se_4$, $(Cu,Ag)_2Zn(Sn,Ge)(S,Se)_4$, $Cu_2(Zn,Mg)(Sn,Ge)S_4$, $Cu_2(Zn,Mg)(Sn,Ge)Se_4$, $Cu_2(Zn,Mg)(Sn,Ge)(S,Se)_4$, $(Cu,Ag)_2(Zn,Mg)(Sn,Ge)(S,Se)_4$, $(Cu,Ag)_2(Zn,Mg)(Sn,Ge)S_4$, $(Cu,Ag)_2(Zn,Mg)(Sn,Ge)Se_4$, $(Cu,Ag)_2(Zn,Mg)Sn(S,Se)_4$, $(Cu,Ag)_2(Zn,Mg)SnS_4$, $(Cu,Ag)_2(Zn,Mg)SnSe_4$, $Cu_2(Zn,Cd)SnS_4$, $Cu_2(Zn,Cd)Sn(S,Se)_4$, $Cu_2(Zn,Cd)Sn(S,Se)_4$, $(Li,Cu)_2ZnSn(S,Se)_4$, $(Li,Cu)_2ZnSnS_4$, $(Li,Cu)_2ZnSnSe_4$, $(Cu,Mg)ZnSnSe_4$, $(Cu,Mg)ZnSn(S,Se)_4$, $(Cu,Mg)ZnSnS_4$, $Cu_2ZnSiSe_4$, $Cu_2ZnSiS_4$, $Cu_2ZnSi(S,Se)_4$, $Cu_2Zn(Si,Sn)(S,Se)_4$, $Cu_2Zn(Si,Sn)S_4$, $Cu_2Zn(Si,Sn)Se_4$, $Cu_2(Zn,Fe)SnS_4$, $Cu_2(Zn,Fe)Sn(S,Se)_4$, $Cu_2(Zn,Fe)SnSe_4$, $Cu_2NiSnS_4$, $Cu_2NiSnSe_4$ or $Cu_2NiSn(S,Se)_4$.

* * * * *